US007468104B2

(12) United States Patent
Mardian et al.

(10) Patent No.: US 7,468,104 B2
(45) Date of Patent: Dec. 23, 2008

(54) CHEMICAL VAPOR DEPOSITION APPARATUS AND DEPOSITION METHOD

(75) Inventors: Allen P. Mardian, Boise, ID (US); Philip H. Campbell, Meridian, ID (US); Craig M. Carpenter, Boise, ID (US); Randy W. Mercil, Boise, ID (US); Sujit Sharan, Chandler, AZ (US)

(73) Assignee: Micron Technology, Inc., Boise, ID (US)

( * ) Notice: Subject to any disclaimer, the term of this patent is extended or adjusted under 35 U.S.C. 154(b) by 543 days.

(21) Appl. No.: 10/150,388

(22) Filed: May 17, 2002

(65) Prior Publication Data

US 2003/0215569 A1 Nov. 20, 2003

(51) Int. Cl.

| | |
|---|---|
| ***C23C 16/455*** | (2006.01) |
| ***C23F 1/00*** | (2006.01) |
| ***H01L 21/306*** | (2006.01) |
| *C23C 16/44* | (2006.01) |

(52) U.S. Cl. .................. 118/715; 118/728; 156/345.33

(58) Field of Classification Search ................ 118/715, 118/722, 728; 156/345.29, 345.33, 345.34, 156/345.51; 137/236.1, 262–264, 266, 571–576, 137/590, 594, 596, 597; 141/44, 285, 286; 261/19–22, 23.1, 40, 94–96, 100–102, 113, 261/114.1

See application file for complete search history.

(56) References Cited

U.S. PATENT DOCUMENTS

| | | | | |
|---|---|---|---|---|
| 4,217,375 | A | 8/1980 | Adams | 438/784 |
| 4,392,915 | A * | 7/1983 | Zajac | 438/716 |
| 4,444,812 | A | 4/1984 | Gutsche | |
| 4,513,021 | A | 4/1985 | Purdes et al. | 427/579 |
| 4,537,795 | A | 8/1985 | Nath et al. | 427/569 |
| 4,545,327 | A | 10/1985 | Campbell et al. | |
| 4,633,809 | A * | 1/1987 | Hirose et al. | 118/719 |
| 4,640,221 | A * | 2/1987 | Barbee et al. | 118/689 |
| 4,716,852 | A * | 1/1988 | Tsujii et al. | 118/720 |
| 4,738,748 | A * | 4/1988 | Kisa | 438/727 |
| 4,910,043 | A | 3/1990 | Freeman et al. | |
| 5,275,976 | A | 1/1994 | Moslehi | 438/800 |

(Continued)

FOREIGN PATENT DOCUMENTS

| | | |
|---|---|---|
| JP | 02046723 A | 2/1990 |

(Continued)

OTHER PUBLICATIONS

U.S. Appl. No. 09/805,620, filed Mar. 13, 2001, Carpenter et al. (as filed).

*Primary Examiner*—Rudy Zervigon
(74) *Attorney, Agent, or Firm*—Wells St. John P.S.

(57) ABSTRACT

A chemical vapor deposition apparatus includes a deposition chamber defined at least in part by at least one of a chamber sidewall and a chamber base wall. A substrate holder is received within the chamber. At least one process chemical inlet to the deposition chamber is included. At least one of the chamber sidewall and chamber base wall includes a chamber surface having a plurality of purge gas inlets to the chamber therein. The purge gas inlets are separate from the at least one process chemical inlet. A purge gas inlet passageway is provided in fluid communication with the purge gas inlets. Further implementations, including deposition method implementations, are contemplated.

5 Claims, 4 Drawing Sheets

10 18 27 16 25 30 15 24 26 32 12 30 28 14 14 28 20 36 22

U.S. PATENT DOCUMENTS 5,304,279 A 4/1994 Coultas et al. ......... 156/345.49
5,338,363 A 8/1994 Kawata et al.
5,356,120 A 10/1994 Konig et al. ................ 266/175
5,366,585 A 11/1994 Robertson et al. ............. 216/67
5,453,124 A * 9/1995 Moslehi et al. ............. 118/715
5,468,298 A 11/1995 Lei et al. .................... 118/728
5,500,256 A * 3/1996 Watabe ....................... 427/579
5,532,190 A * 7/1996 Goodyear et al. ........... 438/710
5,556,474 A * 9/1996 Otani et al. .............. 118/723 E
5,590,387 A 12/1996 Schmidt et al. ............... 419/36
5,647,912 A * 7/1997 Kaminishizono et al. ... 118/719
5,674,574 A 10/1997 Atwell et al.
5,746,834 A 5/1998 Hanley
5,755,886 A 5/1998 Wang et al. ................. 118/715
5,792,272 A 8/1998 van Os et al.
5,824,158 A 10/1998 Takeuchi et al. ....... 118/723 IR
5,827,370 A 10/1998 Gu ............................ 118/715
5,851,294 A 12/1998 Young et al.
5,884,009 A 3/1999 Okase ........................ 392/418
5,885,751 A * 3/1999 Weidman et al. ............ 430/315
5,972,430 A 10/1999 DiMeo, Jr. et al. ..... 427/255.32
5,983,906 A 11/1999 Zhao et al. .................... 705/28
6,050,506 A * 4/2000 Guo et al. ................... 239/558
6,059,885 A * 5/2000 Ohashi et al. ............... 118/730
6,085,690 A 7/2000 Mizuno .................. 118/723 E
6,113,078 A * 9/2000 Rock ........................... 261/21
6,114,227 A 9/2000 Leksell et al. ............... 438/584
6,132,512 A * 10/2000 Horie et al. ................. 118/715
6,187,101 B1 2/2001 Yoshizawa .................. 118/718
6,197,119 B1 3/2001 Dozoretz et al. ............ 118/715
6,200,893 B1 3/2001 Sneh .......................... 438/685
6,305,314 B1 10/2001 Sneh et al.
6,312,526 B1 11/2001 Yamamuka et al. ......... 118/720
6,344,151 B1 2/2002 Chen et al.
6,426,307 B2 7/2002 Lim ........................... 438/778
6,444,039 B1 * 9/2002 Nguyen ...................... 118/715
6,503,330 B1 1/2003 Sneh .......................... 118/715
6,579,372 B2 6/2003 Park ........................... 118/715
6,638,880 B2 10/2003 Yamamuka et al. ......... 438/758
6,730,613 B1 5/2004 Hwang et al. ............... 438/758
6,890,596 B2 5/2005 Sarigiannis et al.
2002/0157611 A1 10/2002 Bondestam et al. ......... 118/725
2004/0216671 A1 11/2004 Carpenter et al. ........... 118/715

FOREIGN PATENT DOCUMENTS

JP 200237136 * 12/2002

* cited by examiner 10
30
15
36
27
12
14
18
26
20
25
14
22
16
24
12
28
28
30
32
Fig. II 40
28a
44
42
A
42

40b
43
28b
43
28b
43
B
44b
28b
42b 40c
28c
42c
43c
28c
42c
43c 10a
50
15a
56
17
25
56
52
51
52
56

CHEMICAL VAPOR DEPOSITION APPARATUS AND DEPOSITION METHOD

TECHNICAL FIELD

This invention relates to deposition methods and to chemical vapor deposition apparatus.

BACKGROUND OF THE INVENTION

Semiconductor processing in the fabrication of integrated circuitry typically includes the deposition of layers on semiconductor substrates. Exemplary processes include physical vapor deposition (PVD), and chemical vapor deposition (CVD) including atomic layer deposition (ALD). With typical ALD, successive mono-atomic layers are adsorbed to a substrate and/or reacted with the outer layer on the substrate, typically by successive feeding of different precursors to the substrate surface.

Chemical and physical vapor depositions can be conducted within chambers or reactors which retain a single substrate upon a wafer holder or susceptor. The chambers include internal walls which can undesirably have deposition product deposited thereupon in addition to the substrate. This is particularly problematic in ALD and other CVD processes, yet can also occur with PVD chambers. One existing method of protecting or preserving the internal chamber walls is to shield such from the deposition material with one or more removable liners. These liners might be received immediately adjacent or against the internal chamber walls. Alternately, the liners might be displaced therefrom, thereby defining an appreciably reduced volume chamber, or subchamber, within which the substrate is received for deposition. One advantage of using liners is that they can be periodically replaced with new or cleaned liners, thereby extending the life of the deposition chambers. Further and regardless, the spent liners can typically be removed and replaced much more quickly than the time it would take to clean the internal chamber walls at a given cleaning interval.

The invention was motivated in overcoming the above-described drawbacks, although it is in no way so limited. The invention is only limited by the accompanying claims as literally worded without interpretative or other limiting reference to the specification or drawings, and in accordance with the doctrine of equivalents.

SUMMARY

The invention includes deposition methods and chemical vapor deposition apparatus. In one implementation, a chemical vapor deposition apparatus includes a deposition chamber defined at least in part by at least one of a chamber sidewall and a chamber base wall. A substrate holder is received within the chamber. At least one process chemical inlet to the deposition chamber is included. At least one of the chamber sidewall and chamber base wall includes a chamber surface having a plurality of purge gas inlets to the chamber therein. The purge gas inlets are separate from the at least one process chemical inlet. A purge gas inlet passageway is provided in fluid communication with the purge gas inlets. In one implementation, a chemical vapor deposition apparatus includes a chamber defined at least in part by chamber walls. A chamber liner apparatus is included which forms a deposition subchamber within the chamber. A substrate holder is provided within the deposition subchamber. The chamber liner apparatus includes a subchamber surface having a plurality of purge gas inlets to the chamber therein. A purge gas inlet passageway is in fluid communication with the purge gas inlets.

In one implementation, a deposition method includes positioning a substrate within a deposition chamber defined at least in part by chamber walls. At least one of the chamber walls includes a chamber surface having a plurality of purge gas inlets to the chamber therein. A process gas is provided over the substrate effective to deposit material onto the substrate. During the providing, purge gas is emitted to the deposition chamber from the purge gas inlets effective to form an inert gas curtain over the chamber surface. In one implementation, a deposition method includes positioning a substrate within a deposition chamber defined at least in part by chamber walls. The deposition chamber has a component received therein internally of the chamber walls. The component has a surface exposed to the chamber. The surface has a plurality of purge gas inlets to the chamber therein. A process gas is provided over the substrate effective to deposit material onto the substrate. During the providing, purge gas is emitted to the deposition chamber from the purge gas inlets effective to form an inert gas curtain over the component surface within the deposition chamber.

Further implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
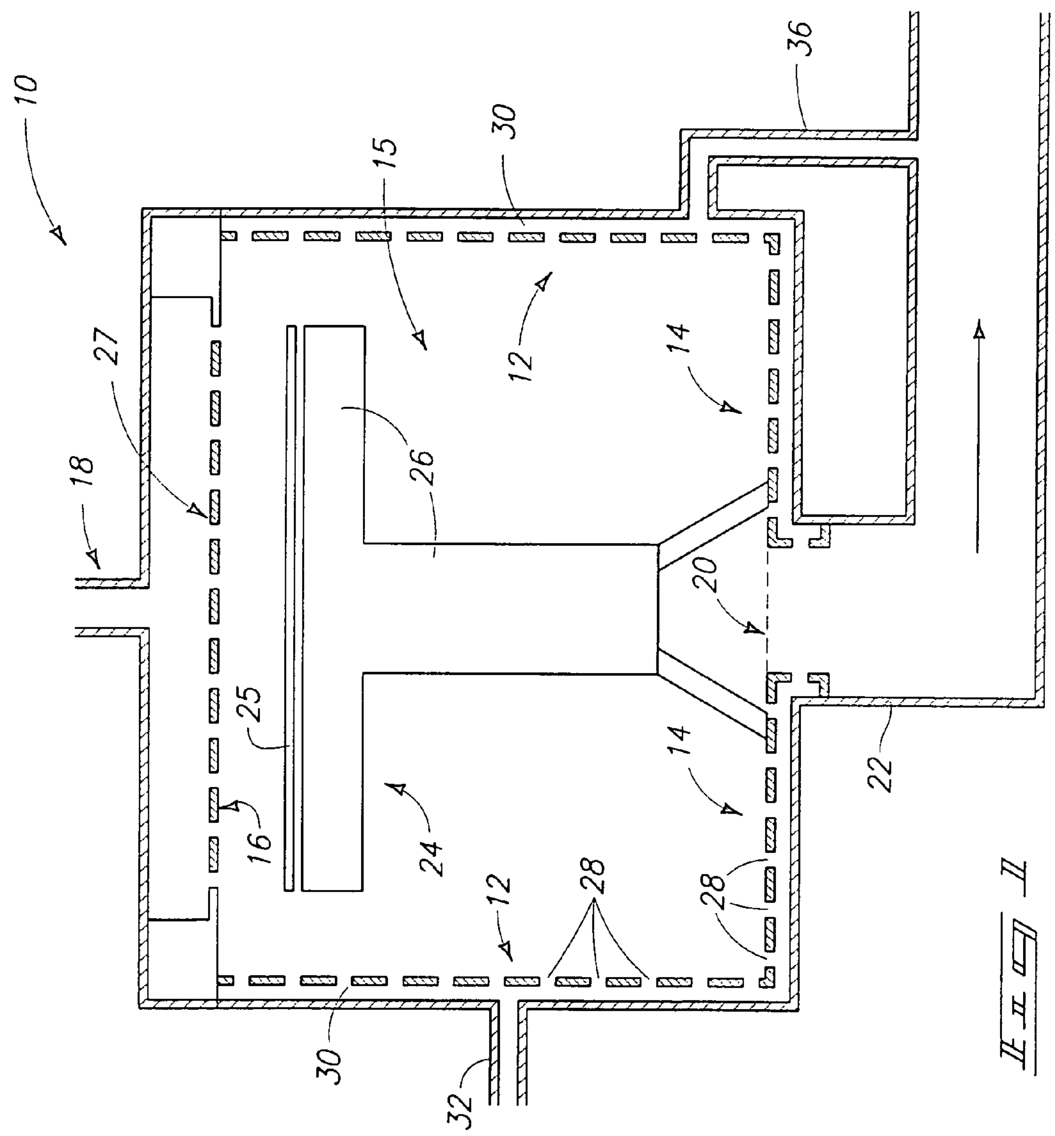
FIG. 1 is a diagrammatic sectional view of a chemical vapor deposition apparatus in accordance with an aspect of the invention.

Referring to FIG. 1, an exemplary embodiment chemical vapor deposition apparatus in accordance with an aspect of the invention is indicated generally with reference numeral 10. Such includes a chamber 15 defined at least in part by chamber walls 12, 14 and 16. Wall or walls 12 comprise a chamber sidewall, wall or walls 14 comprise a chamber base wall, and wall or walls 16 comprise a chamber top wall.

Chamber 15 includes at least one process chemical inlet 18 thereto, and an outlet 20 feeding therefrom. Outlet 20 feeds to a foreline 22 for connection with a vacuum pump (not shown). A suitable substrate holder 24 is provided within chamber 15. Such includes some suitable support structure 26, and is illustrated as receiving a substrate 25, preferably a semiconductor substrate, thereatop. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Process gas inlet 18 is diagrammatically shown as feeding to a showerhead 27 associated with a lid of the apparatus for providing one or more process gasses to substrate 25 for deposition of a material thereon.

Chamber sidewalls 12 and chamber base walls 14 are depicted as having chamber surfaces having a plurality of purge gas inlets 28 to the chamber formed therein. The depicted purge gas inlets are separate or different from process gas inlet 18. Further in the depicted preferred embodiment, a plenum chamber 30 is formed behind walls 12, 14 and is fed by a purge gas inlet passageway 32, which is thereby in fluid communication with purge gas inlets 28. In preferred implementations, walls 12, 14 are constructed of highly porous materials, such as sintered metal particles or fibers, low density teflon, or other synthetic organic and/or inorganic materials, and by way of example only. Material selection would ideally be based on intended process chemistries. Further by way of example only, walls 12, 14 might be constructed to form a screen-like mesh, with pores/outlets 28 being defined by interstices thereof. The pore sizes of the material would depend on material characteristics and deposition process characteristics. Exemplary pore sizes include from tens of microns to tens of Angstroms. Further by way of example only, walls 12, 14 might comprise an essentially solid, hard, planar wall surface having a plurality of openings 28 drilled or otherwise formed therein, such as is shown. In the FIG. 1 depicted preferred embodiment, the chamber surface having the plurality of purge gas inlets 28 is essentially formed on and constitutes both the chamber sidewall and the chamber base wall. Further by way of example only, such purge gas inlets might alternately be included only on either the sidewall or base wall, and also contemplates the chamber surface as being only a portion or portions thereof. Further, purge gas inlets might also be provided on a top wall of chamber 15, for example in manners described herein, and in accordance with U.S. patent application Ser. No. 09/805,620 filed on Mar. 13, 2001, entitled "Chemical Vapor Deposition Apparatus and Deposition Methods", listing Craig M. Carpenter and Ross S. Dando as inventors, and which is hereby incorporated by reference.

In one implementation, and as depicted, the purge gas inlets are substantially uniformly distributed over the chamber surface over which such are received. Further and/or additionally, purge gas inlets 28 might all be of substantially constant size, or of at least two inlet sizes. In one preferred embodiment, at least some of purge gas inlets 28 which are further from chamber outlet 20 are larger than at least some of the purge gas inlets 28 which are closer to chamber outlet 20. Such provides one manner by which, if desired, a greater volumetric flow of purge gas can be provided proximate the respective wall surfaces further from chamber outlet 20 than closer thereto. A purge gas outlet passageway 36 is depicted as extending from purge gas inlet passageway 32, 30 to foreline 22, thereby by-passing the plurality of purge gas inlets 28. Appropriate valving (not depicted) might, of course, be associated with passageway 36 or any other of the depicted passageways/inlets/outlets. A purge gas outlet passageway might be included to assist in control of the flow rate and pressure within plenum chamber 30 and, thereby, also from purge gas inlets 28.

Figures 2, 3, 4:
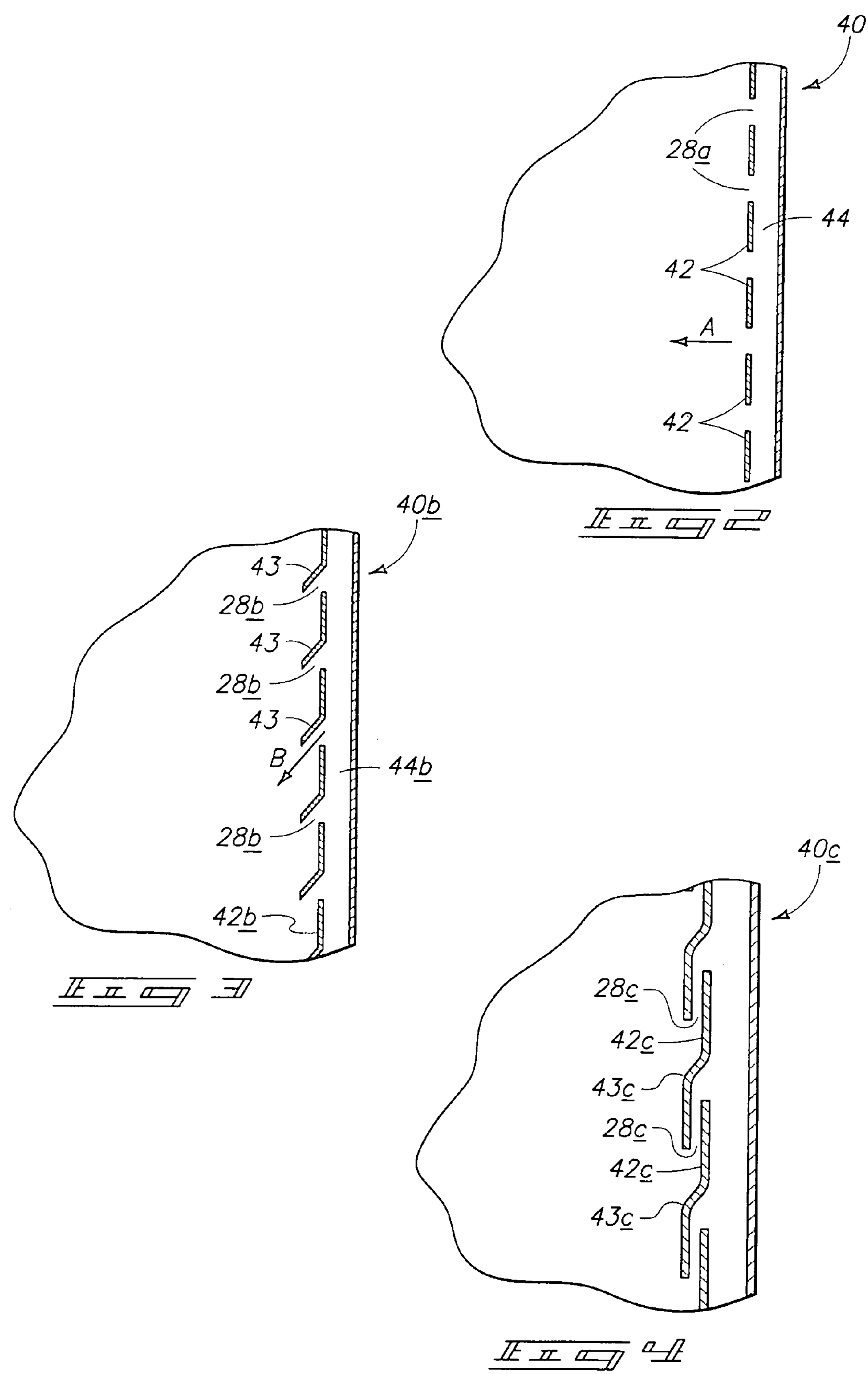
FIG. 2 is an enlarged sectional view of a portion of a chemical vapor deposition apparatus in accordance with an aspect of the invention
FIG. 3 is an enlarged sectional view of a portion of an alternate embodiment chemical vapor deposition apparatus in accordance with an aspect of the invention.
FIG. 4 is an enlarged sectional view of a portion of another alternate embodiment chemical vapor deposition apparatus in accordance with an aspect of the invention.

By way of example only, FIGS. 2, 3 and 4 depict exemplary alternate embodiments of purge gas inlets 28. For example, FIG. 2 depicts an exemplary chamber wall 40 having a chamber surface 42 having a plurality of purge gas inlets 28*a* received therein. Such are depicted as comprising openings extending from a purge gas inlet passageway 44 within wall 40 and which would be exposed to a deposition chamber, for example deposition chamber 15. Accordingly, the exemplary depicted purge gas inlets 28*a* in such embodiment (and inlets 28 in the FIG. 1 embodiment) are configured for discharging purge gas to the chamber in a direction which is substantially transverse, for example in a direction "A" to chamber surface 42. In the context of this document, "a direction substantially transverse" is defined to mean anything from perfectly perpendicular (90°) to the chamber surface to, but not including, 45° from the chamber surface.

FIG. 3 depicts an exemplary alternate embodiment chamber wall 40*b*. Like numerals from the FIG. 2 described embodiment are utilized where appropriate, with differences being indicated by the suffix "b" or with different numerals. Purge gas inlets 28*b* are depicted as being configured for discharging purge gas to the chamber in a direction substantially along chamber surface 42*b*. In the context of this document, "substantially along" means from 45° to parallel with the chamber surface. In the depicted exemplary FIG. 3 embodiment, chamber surface 42*b* is provided (or alternately considered, purge inlets 28*b* are provided) with deflectors/diverters/ramps 43 angled at an exemplary 40° from surface 42*b* for achieving such purge gas discharging generally in a direction "B".

Further by way of example only, FIG. 4 depicts yet another embodiment configuration for purge gas inlets 28*c*. Like numerals from the FIGS. 2 and 3 described embodiments are utilized where appropriate, with differences being indicated with the suffix "c", or with different numerals. In FIG. 4, deflectors 43*c* are depicted as curving or ramping to extend a portion thereof essentially parallel along surface 42*c*.

The invention also contemplates deposition methods utilizing the above-described equipment, and utilizing other equipment. In other words, the apparatus aspects of the invention are independent of the methodical aspects, and the methodical aspects are independent of the apparatus aspects, except with respect to literal claim-recited language, and without limiting or other interpretive reference to the specification and drawings. In accordance with an aspect of the invention, one preferred deposition method positions a substrate within a deposition chamber defined, at least in part, by chamber walls such as, by way of example only, substrate 25 positioned within chemical vapor deposition apparatus 10. At least one of the chamber walls comprises a chamber surface having a plurality of purge gas inlets to the chamber. For example, any multiple set or subset of purge gas inlets 28, in conjunction with the FIG. 1 described embodiment, depict such a plurality of purge gas inlets.

A process gas is provided over the substrate effective to deposit material onto the substrate. In the depicted exemplary FIG. 1 embodiment, one or more process gasses could be provided via process gas inlet 18 to showerhead 27. During the providing of such a process gas effective to deposit material onto the substrate, purge gas is emitted to the deposition chamber from purge gas inlets effective to form an inert gas curtain over the chamber surface having such plurality of purge gas inlets. Exemplary inert purge gases include noble gases and $N_2$. A preferred and desired, although non-limiting, goal of such emitting is to restrict or perhaps completely prevent deposition product or effluent product from depositing upon the chamber surface or surfaces having such purge gas inlets associated therewith. In accordance with preferred methodical aspects of the invention in forming an inert gas curtain, total inert purge gas flow from all inlets is ideally rather low, for example from 100 to 200 sccm in a six liter reactor, so as to not adversely load or undesirably affect the sizing requirements of the vacuum pumping equipment.

In one preferred methodical aspect of the invention, the purge gas is emitted to the chamber in a direction substantially transverse to the chamber surface associated with the purge gas inlets and, in one embodiment, is also effective to form the inert gas curtain to comprise substantially turbulent gas flow proximate the chamber surface. In another preferred embodiment, the purge gas emitting to the chamber is in a direction substantially along the chamber surface and, in one embodiment, is additionally effective to form the inert gas curtain to comprise substantially laminar gas flow proximate the chamber surface. In some operating regimes, viscous or turbulent flow may be desired proximate the surface being protected, whereas in other regimes laminar flow might be desired.

In one embodiment, the purge gas emitting comprises emitting a greater volume of purge gas from at least some purge gas inlets located further from the chamber outlet than from at least some purge gas inlets located closer to the chamber outlet. Such might be accommodated by providing larger outlets further from the chamber outlet than closer to the chamber outlet, and/or by providing greater flow and/or pressure to the purge gas inlets which are located further/furthest from the chamber outlet. In accordance with methodical aspects of the invention, preferred depositions include chemical vapor deposition, including atomic layer deposition.

Figure 5:
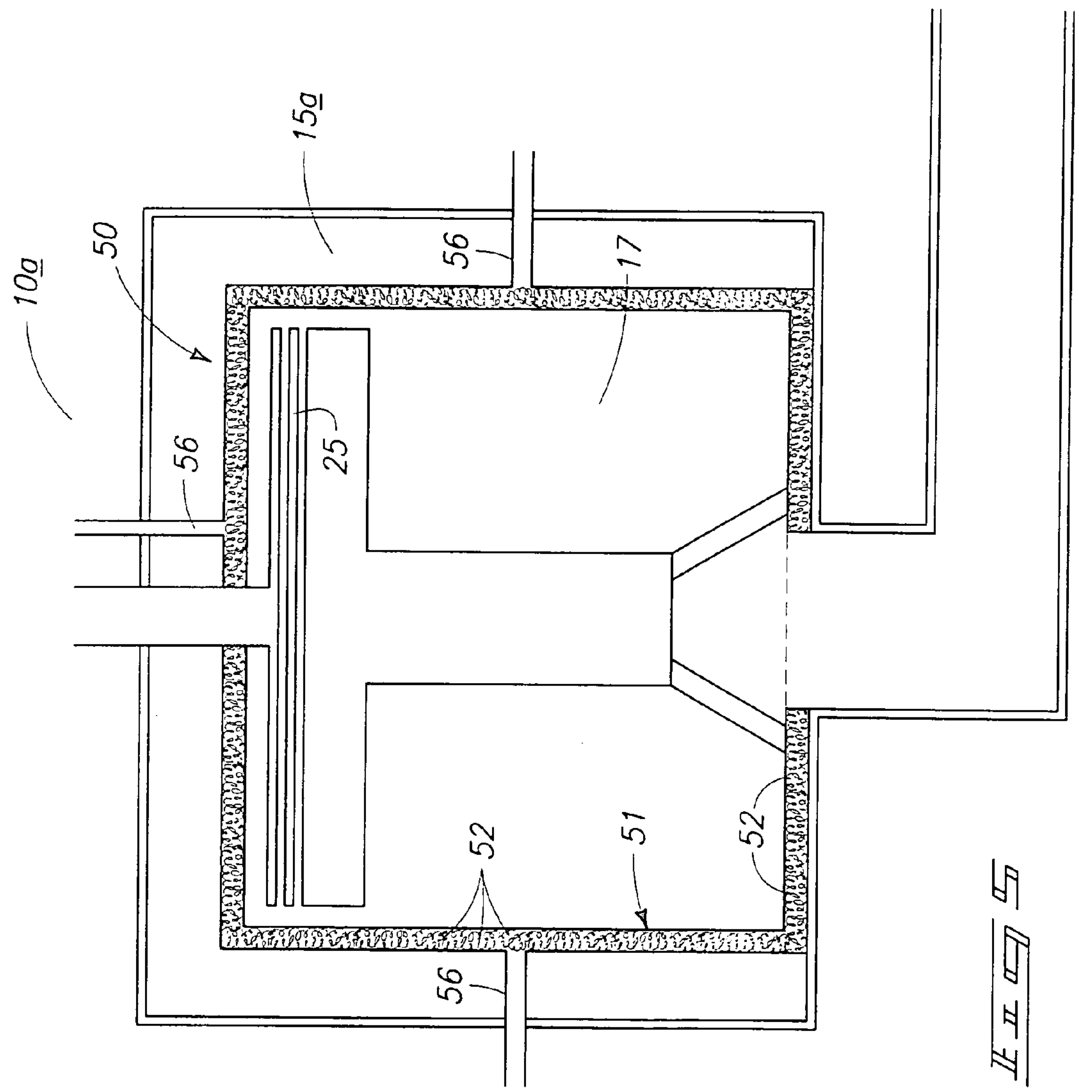
FIG. 5 is a diagrammatic sectional view of an alternate chemical vapor deposition apparatus in accordance with an aspect of the invention.

The above-described exemplary embodiments/implementations were essentially in conjunction with chamber walls which effectively define a maximum internal volume within a deposition apparatus 10. FIG. 5 depicts an exemplary alternate chemical vapor deposition apparatus 10*a*. Like numerals from the FIG. 1 described embodiment are utilized where appropriate, with differences being indicated with the suffix "a", or with different numerals. Chemical vapor deposition apparatus 10*a* includes a chamber liner apparatus 50 forming a deposition subchamber 17 within chamber 15*a*. Chamber liner apparatus 50 comprises subchamber surfaces 51 having a plurality of purge gas inlets 52 to the subchamber therein. By way of example only, purge gas inlets 52 might be configured in any of the manners described above, including the depictions with respect to inlets 28, 28*a*, 28*b* and 28*c* described above. Further, liner apparatus 50 would ideally be configured or fabricated to be an easily replaceable component of apparatus 10*a*. By way of example only, the exemplary FIG. 5 embodiment depicts the various walls of liner apparatus 50 as comprising a retained intertwined, mesh-like material which is fed by a plurality of purge gas inlet passageways 56 for providing the desired purge gas thereto during deposition. Other preferred attributes of the FIGS. 1-4 depicted apparatus, and all methods, as described above can be incorporated with chamber liner apparatus 50.

Figure 6:
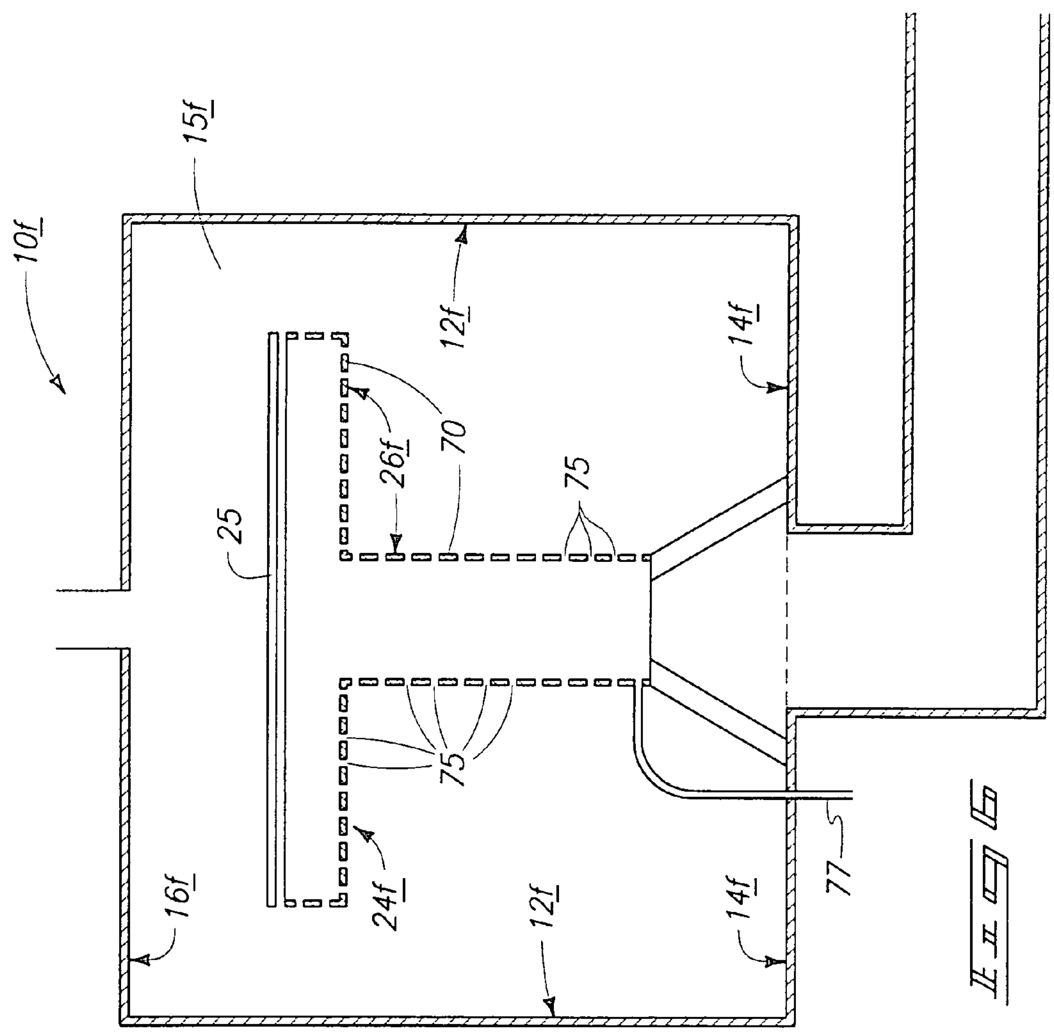
FIG. 6 is a diagrammatic sectional view of another alternate chemical vapor deposition apparatus in accordance with an aspect of the invention.

In accordance with some aspects and implementations of the invention, alternate exemplary embodiments are described with reference to FIG. 6. Like numerals from the first-described embodiments are utilized where appropriate, with differences being indicated with the suffix "f", or with different numerals. FIG. 6 depicts a chemical vapor deposition apparatus 10*f* comprising a deposition chamber 15*f* which is at least in part defined by chamber walls 12*f*, 14*f* and 16*f*. Substrate holder 24*f* comprises support structure 26*f*. Such includes a surface or surfaces 70 exposed to chamber 15*f* and which comprise(s) a plurality of purge gas inlets 75 to chamber 15*f*. An exemplary purge gas inlet passageway 77 is shown in communication with support structure 26*f*, and accordingly with purge gas inlets 75. Such purge gas inlets might have any of the attributes described above with respect to the other described embodiments. The FIG. 6 10*f* depicted apparatus might be utilized in conjunction with purge gas to preclude, or at least reduce, the undesired deposition of material onto the depicted surface or surfaces of the substrate holder support structure.

Regardless, and in accordance with another methodical implementation of the invention, a deposition method comprises positioning a substrate within a deposition chamber defined at least in part by chamber walls. The deposition chamber comprises a component received therein internally of the chamber walls. By way of example only, substrate holder 24*f* and its associated support structure 26*f* is one exemplary such component. However, any other component is contemplated in accordance with this methodical aspect of the invention. The component comprises a surface, exposed to the chamber, which has a plurality of purge gas inlets to the chamber therein. A process gas is provided over the substrate effective to deposit material onto the substrate. During providing of the process gas, purge gas is emitted to the deposition chamber from the purge gas inlets effective to form an inert gas curtain over the component surface within the deposition chamber. A preferred effect is to prevent, or at least reduce, undesired material from depositing onto such component surface. Any other attribute, as described above with respect to other methodical aspects of the invention, is of course contemplated.

Control of the purge gas flow can be through a variety of methods, such as an active feedback control loop based on a pressure sensors ported to the purge gas channels and linked to mass flow controllers, needle valves, EMCO digital valve-type flow control, line pressure regulators or other existing or yet-to-be developed methods.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A chemical vapor deposition apparatus comprising:

a deposition chamber defined at least in part by a chamber sidewall and a chamber base wall;

a substrate holder within the chamber;

at least one process chemical inlet to the deposition chamber, the at least one process chemical inlet passing through a chamber lid which opposes the chamber base wall;

a chamber outlet;

at least one of the chamber sidewall and chamber base wall comprising a chamber surface having a plurality of purge gas inlets to the chamber therein, the purge gas inlets being separate from the at least one process chemical inlet;

a purge gas inlet passageway in fluid communication with the purge gas inlets; and wherein the purge gas inlets are of at least two different inlet sizes, at least some of the purge gas inlets further from the chamber outlet being larger than at least some of the purge gas inlets closer to the chamber outlet.

2. The apparatus of claim 1 wherein the purge gas inlet passageway comprises a plenum chamber to the purge gas inlets.

3. The apparatus of claim 1 wherein the purge gas inlets are configured for discharging purge gas to the chamber in a direction substantially transverse to the chamber surface.

4. The apparatus of claim 1 wherein the purge gas inlets are configured for discharging purge gas to the chamber in a direction substantially along the chamber surface.

5. The apparatus of claim 1 wherein the substrate holder has an upper surface over which a substrate to be deposited upon within the chamber is to be received, the deposition chamber has a sidewall, the chamber surface having the plurality of purge gas inlets being on the chamber sidewall, the chamber surface extending from elevationally higher than the substrate holder upper surface to elevationally lower than the substrate holder upper surface, the plurality of purge gas inlets being received at least elevationally lower than the substrate holder upper surface.

* * * * *